(12) United States Patent
Wen et al.

(10) Patent No.: US 9,219,867 B2
(45) Date of Patent: Dec. 22, 2015

(54) METHOD AND APPARATUS FOR COMPRESSIVE IMAGING OF A SCENE USING A SINGLE PIXEL CAMERA

(71) Applicant: Xerox Corporation, Norwalk, CT (US)

(72) Inventors: Xuejin Wen, Fairport, NY (US); Edgar A. Bernal, Webster, NY (US); Lalit K. Mestha, Fairport, NY (US)

(73) Assignee: Xerox Corporation, Norwalk, CT (US)

( * ) Notice: Subject to any disclaimer, the term of this patent is extended or adjusted under 35 U.S.C. 154(b) by 113 days.

(21) Appl. No.: 14/227,595

(22) Filed: Mar. 27, 2014

(65) Prior Publication Data

US 2015/0281543 A1    Oct. 1, 2015

(51) Int. Cl.
*H04N 5/235* (2006.01)
*H03M 7/30* (2006.01)

(52) U.S. Cl.
CPC ........... *H04N 5/2354* (2013.01); *H03M 7/3062* (2013.01)

(58) Field of Classification Search
CPC ..................... G02B 2207/129; G06T 2200/21; H03M 7/3062
USPC .......................... 250/363.06, 237 R; 356/310
See application file for complete search history.

(56) References Cited

U.S. PATENT DOCUMENTS

| 8,199,244 | B2 | 6/2012 | Baraniuk et al. | |
|---|---|---|---|---|
| 2010/0246920 | A1* | 9/2010 | Vaswani | G06K 9/00523 382/131 |
| 2012/0162457 | A1* | 6/2012 | Veeraraghavan | H04N 5/2254 348/222.1 |
| 2013/0194481 | A1* | 8/2013 | Golub | H04N 9/045 348/336 |

* cited by examiner

*Primary Examiner* — Mekonnen Dagnew (57) ABSTRACT

A method, non-transitory computer readable medium, and apparatus for compressive imaging of a scene in a single pixel camera are disclosed. For example, the method moves a pseudo-random pattern media behind an aperture until a pseudo-random sampling function of a plurality of pseudo-random sampling functions is viewable through the aperture, records a value of an intensity of a modulated light from the scene with a detector, wherein the intensity of the modulated light is representative of an inner product between the pseudo-random sampling function and an image of the scene and repeats the moving and the recording until a necessary number of a plurality of inner products are processed.

20 Claims, 6 Drawing Sheets

FIG. 6

METHOD AND APPARATUS FOR COMPRESSIVE IMAGING OF A SCENE USING A SINGLE PIXEL CAMERA

The present disclosure relates generally to single pixel cameras and, more particularly, to a method and apparatus for compressive imaging of a scene using a pseudo-random pattern digital light modulator for a single pixel camera.

BACKGROUND

In the last few years, single pixel cameras utilizing compressive sensing technologies have been developed. Single pixel cameras have the capability to reconstruct two dimensional (2D) images from sequential measurements using a single photo detector coupled with a spatial light modulator. This mode of operation is in contrast with traditional 2D image sensors (e.g., silicon based charge-coupled device (CCD), complementary metal oxide-semiconductor (CMOS) sensors for visible and near infrared imaging, and mercury cadmium telluride (MCT) and microbolometer imaging sensors for thermal imaging), which perform simultaneous spatial sampling.

Current digital light modulator (DLM) technologies for spatial light modulation include digital light processing (DLP), liquid crystal display (LCD) and liquid crystal on silicon (LCOS). However, none of these technologies available on the commercial market can achieve the switching requirements to perform the hundreds of thousands of measurements required to reconstruct a multi-mega-pixel image in a reasonably short amount of time.

One type of technology that could achieve the switching requirements (i.e., max binary switch frequency of approximately 32 kilohertz (kHz)) to reconstruct the image for a single pixel camera is a digital mirror device (DMD). However, the DMD is a micro-opto-electro-mechanical system (MOEMS) device that is complex and very expensive (e.g., $13,000 for a 1024×768 pixel DMD development kit). In addition, the DMD requires a complicated auxiliary controller circuitry to turn on and off each micromirror for every acquisition, which makes it bulky and inconvenient to integrate into a portable system.

SUMMARY

According to aspects illustrated herein, there are provided a method, a non-transitory computer readable medium, and an apparatus for compressive imaging of a scene in a single pixel camera. One disclosed feature of the embodiments is a method that moves a pseudo-random pattern media behind an aperture until a pseudo-random sampling function of a plurality of pseudo-random sampling functions is viewable through the aperture, records a value of an intensity of a modulated light from the scene with a detector, wherein the intensity of the modulated light is representative of an inner product between the pseudo-random sampling function and an image of the scene and repeats the moving and the recording until a necessary number of a plurality of inner products are processed.

Another disclosed feature of the embodiments is a non-transitory computer-readable medium having stored thereon a plurality of instructions, the plurality of instructions including instructions which, when executed by a processor, cause the processor to perform an operation that moves a pseudo-random pattern media behind an aperture until a pseudo-random sampling function of a plurality of pseudo-random sampling functions is viewable through the aperture, records a value of an intensity of a modulated light from the scene with a detector, wherein the intensity of the modulated light is representative of an inner product between the pseudo-random sampling function and an image of the scene and repeats the moving and the recording until a necessary number of a plurality of inner products are processed.

Another disclosed feature of the embodiments is an apparatus comprising a processor and a computer readable medium storing a plurality of instructions which, when executed by the processor, cause the processor to perform an operation that moves a pseudo-random pattern media behind an aperture until a pseudo-random sampling function of a plurality of pseudo-random sampling functions is viewable through the aperture, records a value of an intensity of a modulated light from the scene with a detector, wherein the intensity of the modulated light is representative of an inner product between the pseudo-random sampling function and an image of the scene and repeats the moving and the recording until a necessary number of a plurality of inner products are processed.

BRIEF DESCRIPTION OF THE DRAWINGS

The teaching of the present disclosure can be readily understood by considering the following detailed description in conjunction with the accompanying drawings, in which.

To facilitate understanding, identical reference numerals have been used, where possible, to designate identical elements that are common to the figures.

DETAILED DESCRIPTION

The present disclosure broadly discloses a method and non-transitory computer-readable medium for compressive imaging of a scene using a single pixel camera. As discussed above, single pixel cameras have advantages over traditional cameras. However, there are currently no commercially available digital light modulators that can perform the number of switching operations required for a number of samples needed of an image.

One option that is currently available is a DMD that is very complex and very expensive. The DMD also requires a complicated auxiliary controller circuitry to manipulate each micromirror for every acquisition, which makes it bulky and inconvenient to integrate into a portable system.

One embodiment of the present disclosure addresses this problem by providing a pseudo-random pattern digital light modulator that includes a plurality of pseudo-random sampling functions printed onto a physical medium. For example, the pseudo-random sampling functions may be printed on a physical medium (e.g., silicon or quartz) via a lithography and etching process to fabricate a physical medium containing a plurality of different pseudo-random sampling functions that can be selected as needed to perform compressive sensing of an image to be captured or reconstructed with the single pixel camera. In one embodiment, the random pattern media with the printed pseudo-random sampling functions may be coupled to a motor such that the pseudo-random pattern media may be moved around behind an aperture one pixel length or width at a time to obtain a different pseudo-random sampling function printed on the pseudo-random pattern media. The pseudo-random pattern media may be moved around until a necessary number of the pseudo-random sampling functions for imaging a scene have been used for sampling.

As a result, the present disclosure provides a method for compressive sensing of an image in a single pixel camera using a relatively low-cost pseudo-random pattern digital light modulator. If different pseudo-random sampling functions are desired, a new pseudo-random pattern media may be printed using known lithography and etching process for a relatively low cost. Due to the minimal mechanical features compared to the currently used DMD and the accompanying circuitry, the overall size may also be smaller allowing for implementation in portable single pixel camera designs.

It should be noted that any type of pseudo-random sampling function (e.g., sampling functions extracted from sub-Gaussian distributions, Bernoulli or uniform distributions) may be used. It should be noted that the mathematics behind using pseudo-random sampling functions to solve an undetermined system of linear equations resulting from the reduced number of measurements used in compressive sensing is well known in the art and are not discussed herein in detail for simplicity.

Figure 1:
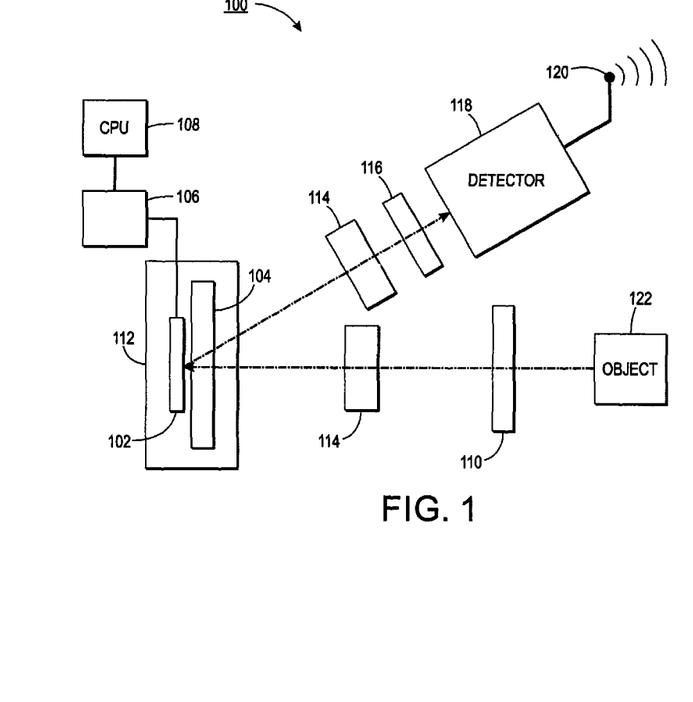
FIG. 1 illustrates an example schematic diagram of a single pixel camera of the present disclosure.

FIG. 1 illustrates an example single pixel camera 100 of the present disclosure. In one embodiment, the single pixel camera 100 may include a first imaging system 110, one or more filters 114, a pseudo-random pattern digital light modulator 112, a collection imaging system 116 and a detector 118. In one embodiment, the detector 118 may be a photodetector. In one embodiment, the first imaging system 110 may comprise one or more separate lenses that work together as a system. In one embodiment, the collection imaging system 116 may comprise one or more separate lenses that work together as a system.

In one embodiment, the pseudo-random pattern digital light modulator 112 may comprise a pseudo-random pattern media 102 and an aperture 104. The pseudo-random pattern media 102 may be coupled to a motor 106 to move the pseudo-random pattern media 102 around behind the aperture 104. The motor 106 may be a stepper motor, a servo motor, and the like.

In one embodiment, the single pixel camera 100 may be aimed at an object 122. The single pixel camera 100 may take a plurality of samples (e.g., light coming from the object 122) of the image in a serial fashion. Light coming from the object can include light reflected off or emanating from the object. As discussed above, the pseudo-random pattern media 102 may be moved around behind the aperture 104 via the motor 106. The movements of the motor 106 may be controlled by a processor (e.g., a central processing unit (CPU)) or controller 108. Unlike previous designs of single pixel cameras that use a DMD, as discussed above, the single pixel camera 100 uses the pseudo-random pattern digital light modulator 112 to modulate the light from the object 122 or a scene in order to perform pixel-wise products between the pseudo-random sampling functions and the image of the scene.

In one embodiment, light coming from the object 122 is projected onto pseudo-random pattern media 102 through the first imaging system 110. The size of each one of the plurality of pseudo-random sampling functions on the random pattern media 102 may be equal to a projected size of the system aperture on the plane defined by the random pattern media 102. The system aperture is the minimum opening across the full optical path for through which light propagates from the object to the photodetector; this optical path includes both the first imaging system 110 and the collection imaging system 116. The projection is dictated by the optics of the optical imaging system to which the aperture belongs. If the system aperture consists of at least one of the object 122, the first imaging system 110, and the optical filter 114, the projection is dictated by the first imaging system 110. If the system aperture consists of at least one of the optical filter 114, the collection imaging system 116, and the photodetector 118, the projection is dictated by the collection imaging system 116. In any other case, the projection is determined by the optics of the first imaging system and the collection imaging system together.

The light from the object 122 or the scene that is modulated by the pseudo-random pattern digital light modulator 112 may be sent to the detector 118. The detector 118 may then integrate the modulated light into a value of an intensity of the modulated light. The value of the intensity of the modulated light may be representative of the inner product between the pseudo-random sampling function used on pseudo-random pattern media 102 and an image of the scene. The inner product can then be recorded by the detector 118.

In one embodiment, the value of inner products between a necessary number of pseudo-random sampling functions and an image of the scene may be used by the processor 108 to reconstruct the image. In another embodiment, the reconstruction of the image may be performed by another system. For example, the value of the inner products between a necessary number of pseudo-random sampling functions and an image of the scene may be stored for later processing or transmitted via a wireless transmitter 120 to a receiving system that is used to reconstruct the image.

In one embodiment, the necessary number may be based on a desired number of samples of the object 122 or the scene. For example, for a higher compression ratio or a lower reconstruction quality, fewer pseudo-random sampling functions may be used. Conversely, for a lower compression ratio or a higher reconstruction quality, a larger number of pseudo-random sampling functions may be used.

Figure 2:
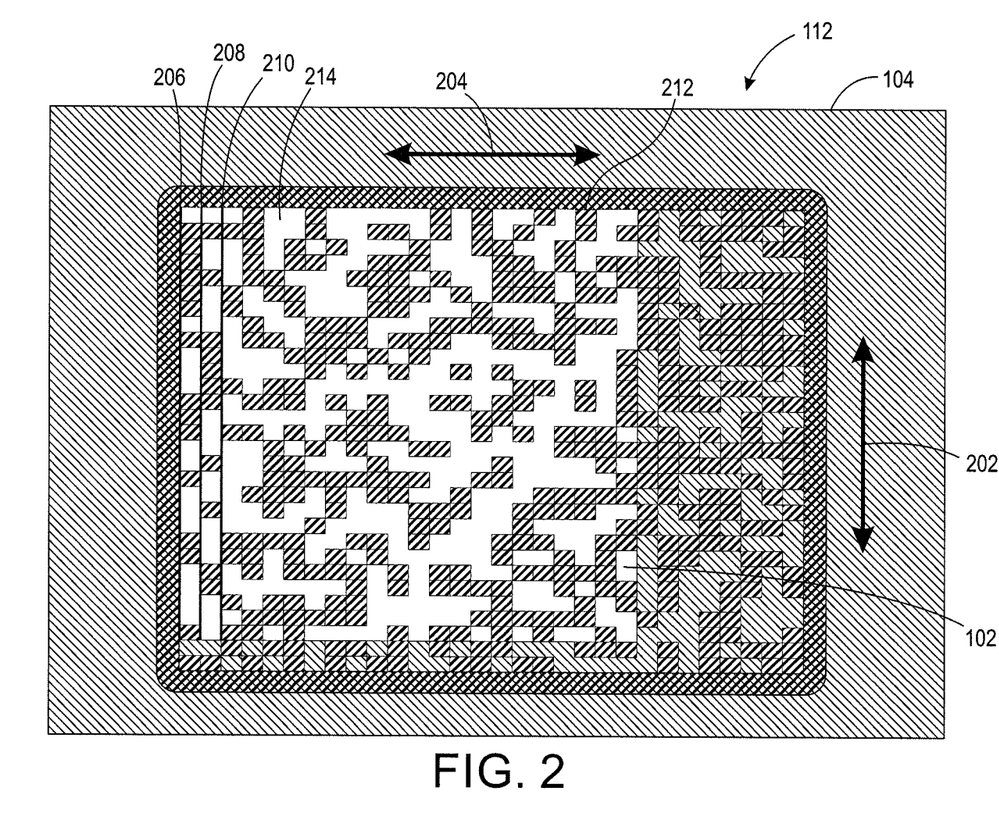
FIG. 2 illustrates an example of a pseudo-random pattern digital light modulator.

FIG. 2 illustrates an example block diagram of the pseudo-random pattern digital light modulator 112. As discussed above, the pseudo-random pattern digital light modulator comprises the pseudo-random pattern media 102 and the aperture 104. In one embodiment, the pseudo-random pattern media 102 may be moved around behind the aperture 104 in a vertical direction 202 and/or a horizontal direction 204.

In one embodiment, the motor 106 may move the pseudo-random pattern media 102 one pixel at a time in the horizontal direction 204 or the vertical direction 202. For example, one position may be shown by box 206, a second position may be shown by box 208, a third position may be shown by box 210, and so forth.

In one embodiment, the pseudo-random pattern media 102 may comprise a plurality of different pseudo-random sampling functions that can be selected as needed to perform compressive sensing of a scene. A subset of pixels within the large pseudo-random pattern media 102 may represent different pseudo-random sampling functions. In one embodiment, the subset of pseudo-random sampling functions within the pseudo-random pattern media 102 may overlap one another on the pseudo-random pattern media 102 and be offset by one pixel length or width. Thus, each position offset by a pixel length or width, shown in boxes 206, 208 and 210, may represent a different pseudo-random sampling function.

In other words, each time the pseudo-random pattern media 102 is moved by a length or width equivalent to one pixel length or one pixel width behind the aperture 104, a different pseudo-random sampling function is revealed or viewed that is different from and largely uncorrelated to the previous pseudo-random sampling function that was previously revealed or viewed through the aperture 104. To illustrate by example, assume a 700 pixel×700 pixel image of a scene is being reconstructed and it is determined that one hundred pseudo-random sampling functions are needed to provide a sufficient quality of the reconstructed image. Then, the pseudo-random pattern media 102 may be printed to be 700 pixels by 799 pixels. In other words, each movement of the pseudo-random pattern media 102 behind the aperture one pixel length or width at a time (e.g., displaying pixel rows 1-700, moving one pixel length to display pixel rows 2-701, moving one pixel length to display pixel rows 3-702 and so forth to display pixel rows 100-799) would display each one of the 100 different pseudo-random sampling functions that are printed on the pseudo-random sampling media 102 one at a time. Pseudo-random pattern media with different dimensions can be used as long as their dimensions permit the required number of measurements; for example a pseudo-random pattern media with 703 pixels by 724 pixels can also enable one hundred measurements in the reconstruction process of a 700 pixel×700 pixel image of a scene. If, on the other hand, a 700 pixel row×750 pixel column image of a scene is being reconstructed and it is determined that one hundred pseudo-random sampling functions are needed to provide a sufficient quality of the reconstructed image, then the pseudo-random pattern media 102 may be printed to be 700 pixels by 849 pixels.

The above is only one example of how the different pseudo-random sampling functions can be viewed on the pseudo-random pattern media 102. For example, the pseudo-random pattern media 102 may be 749 pixels by 701 pixels to provide 100 different pseudo-random sampling functions. In other words, the pseudo-random pattern media 102 may be moved one pixel length at a time horizontally 49 times then one pixel length vertically one time, then one pixel length at a time horizontally 49 times for a total of 100 different pseudo-random sampling functions. In other words, how the pseudo-random sampling functions are viewed on the pseudo-random pattern media 102 is not necessarily important as long as the pseudo-random pattern media 102 is moved such that each pixel movement horizontally or vertically allows a completely different pseudo-random sampling function to be viewed through the aperture 104.

Although the above examples describe the pseudo-random pattern media 102 moving one pixel length or width at a time for ease of explanation, it should be noted that the pseudo-random pattern media 102 may be moved in a horizontal and/or vertical direction in multiple pixel length or width increments. In other words, the pseudo-random pattern media 102 can be moved any arbitrary number of pixel lengths or widths at a time, as long as its dimensions allow for the displacement and to display a different number of pseudo-random sampling functions that may be required. In one embodiment, the pseudo-random pattern media 102 may be moved in a circular motion one pixel length or width at a time. Other motion patterns than those described herein can be implemented other.

In one embodiment, each pixel may be a square and has a same length and width. In other words, the term length and width may refer to a same measured distance. In another embodiment, each pixel may be a rectangular shape and the length may have a different measured distance than the width.

In one embodiment, each one of the pseudo-random sampling functions may have a size that is equal to a projected size of the opening of the aperture 104 and the aperture 104 may be smaller than an overall size of the pseudo-random pattern media 102. For example, the pixels that are viewable through the aperture 104 are only a portion of the pseudo-random pattern media 102 and represent one of the pseudo-random sampling functions. Thus, a different pseudo-random sampling function is viewable through the aperture 104 with each movement of the pseudo-random pattern media 102 one pixel at a time in either a vertical direction 202 or a horizontal direction 204, as noted above.

Figure 3:
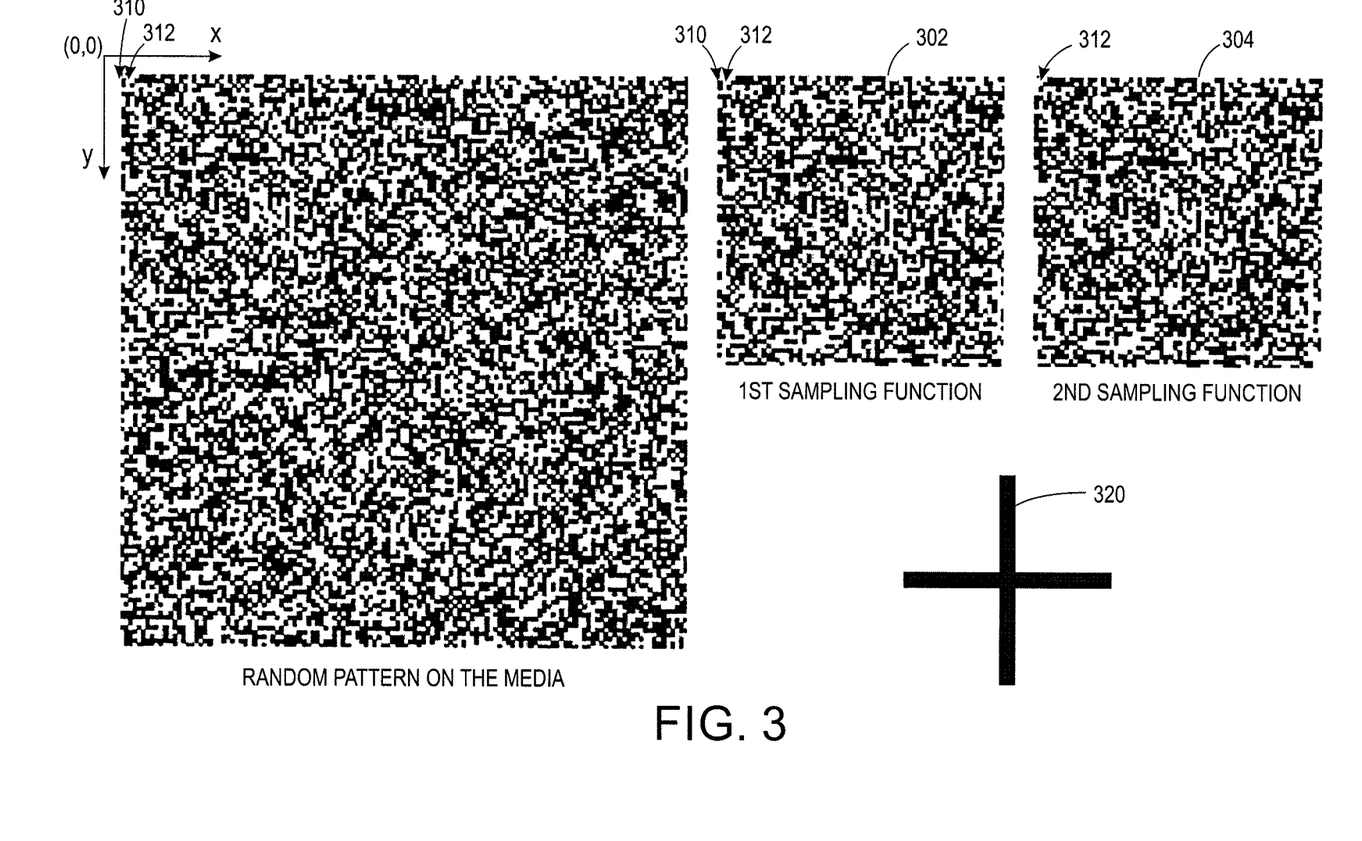
FIG. 3 illustrates an example of the pseudo-random pattern media and example pseudo-random sampling functions printed on the pseudo random pattern media and an original image to be sampled.

In one embodiment, FIG. 3 illustrates the 128×128 pixel pseudo-random pattern that is printed on the pseudo-random pattern media 102. FIG. 3 also illustrates a first sampling function 302 and a second sampling function 304, each comprising 64×64 pixels, assuming the sampling process starts with the sampling function at the top left of the pseudo-random pattern media 102 and continues by displacing the pseudo-random pattern media 102 by one pixel width in the horizontal direction. That is to say, the first sampling function corresponds to the upper left 64×64 pixel block of the pseudo-random pattern 302 printed on the pseudo-random pattern media 102, and the second sampling function 304 corresponds to the pattern that is visible once the media is displaced one column to the right relative to the first sampling function 302.

In other words, FIG. 3 illustrates a first column 310 and a second column 312. The beginning of the first sampling function 302 begins with the corresponding first column 310 of the pseudo-random pattern media 102. The beginning of the second sampling function 304 beings with the corresponding second column 312 of the pseudo-random pattern media 102.

After obtaining 65 inner product measurements corresponding to the first 65 sampling functions resulting from repeatedly moving the pseudo-random pattern media 102 one column to the right at each iteration, the 66$^{th}$ sampling function may be obtained by moving the pseudo-random pattern media 102 one row down and continuing the sampling process in the reverse horizontal direction relative to the first set of samples, that is, by displacing the media one column to the left at each iteration until 65 more samples are obtained.

Alternatively, the horizontal position of the media can be reset to its initial state while maintaining the current vertical position and the sampling process can continue in the same horizontal direction as the first set of samples, that is, by displacing the media one column to the right at each iteration. It should be noted that the above is one example and other displacement patterns are possible. Independently of the sampling sequence, the total number of 64×64 pixel sampling functions that can be obtained with single pixel displacements (at each iteration) of a 128×128 pixel pseudo-random pattern media 102 is 4225.

Figure 4:
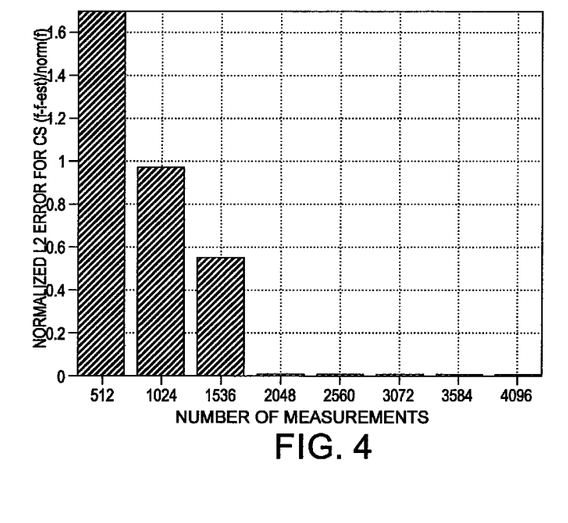
FIG. 4 illustrates a table of convergence versus a number of measurements.

FIG. 3 also illustrates an example original image 320 to be sampled and reconstructed with the pseudo-random pattern media 102 and sampling functions 302 and 304. Reconstruction error can be measured by computing the normalized $L_2$ norm between the original image and the reconstructed image. Other error metrics such as the signal to noise ratio (SNR), peak SNR (pSNR), mean squared error (MED) and mean absolute difference (MAD) can also be used. As the number of samples involved in the sampling process increases, the reconstruction error is expected to decrease, as illustrated by FIG. 4, which shows the progression of the reconstruction error as a function of the number of measurements. It can be seen that given the chosen set of sampling functions and reconstruction algorithms, acceptable reconstruction is achieved with at least 2048 measurements.

In one embodiment, any type of physical medium (e.g., a silicon wafer, a quartz wafer, and the like) may be used for the pseudo-random pattern media 102. The pseudo-random sampling patterns may be printed or fabricated onto the physical medium using traditional patterning and etching technologies, such as for example, a lithography process followed by a wet etch or a dry etch process. Thus, the pseudo-random pattern media 102 may be relatively inexpensive compared to a traditional DMD that comprises hundreds of mechanical mirrors and may require complicated algorithms and hardware to control the switching of each one of the mechanical mirrors.

In one embodiment, each one of the pseudo-random sampling functions may comprise one or more reflective portions 212 represented by the black pixels and one or more optically clear portions 214 represented by the white pixels. In one embodiment, the pseudo-random pattern digital light modulator 112 may operate in a transmissive mode. In the transmissive mode, the pseudo-random pattern digital light modulator 112 may direct light through the optically clear portions 214 at a designated angle toward the detector 118 and block the light away from the detector 118 via the reflective portions 212. In one embodiment, the opaqueness of the one or more optically clear portions 214 may be adjusted to control an amount of light that is permitted to pass through to the detector 118 to obtain values between 0 and 1.

In one embodiment, the pseudo-random pattern digital light modulator 112 may operate in a reflective mode. In the reflective mode, the pseudo-random pattern digital light modulator 112 may direct or reflect light by the reflective portions 212 at a designated angle towards the detector 118 and allows the light signal through the optically clear portions 214 away from the detector 118.

In one embodiment, the overall number of pseudo-random sampling functions that are printed onto the pseudo-random pattern digital light modulator 112 may be a function of a desired reconstruction quality of the image. A necessary number of the pseudo-random sampling functions that are processed may be a function of a desired compression ratio. For example, if reconstruction of a 100 pixel×100 pixel image is desired (the image having a total of 10,000 pixels), and the desired compression ratio is 10%, then only 1,000 different pseudo-random sampling functions on the pseudo-random pattern media 102 would need to be processed. For example, the more pseudo-random sampling functions that are processed, the lower the compression of the scene will be (i.e., the percentage becomes closer to using the entire large pseudo-random sampling function of 10,000 pixels in the example above). Conversely, the fewer pseudo-random sampling functions that are used, the higher the compression of the scene will be. Note that the aspect ratio of the reconstructed image, that is, the ratio between the number of rows and the number of columns in the image is not limited to be 1:1. The dimensions of the pseudo-random sampling functions determine the dimensions of the reconstructed image.

At a high level, compressive sensing performs sampling and compression simultaneously in a sequential manner using pseudo-random sampling functions. In addition, compressive sensing uses a small subset of all available samples of a scene in a sequential or serial order to reproduce an image (as opposed to using all samples and analyzing all samples simultaneously for traditional CMOS sensor technology). In compressive sensing, a small subset of pseudo-random sampling functions of all the pseudo-random sampling functions available for an image and an associated value of inner products for each one of the small subset of pseudo-random sampling functions and an image of the scene recorded by a detector are used to reproduce the image.

In one embodiment, the pseudo-random sampling functions selected for a particular sized image is printed onto the random pattern digital light modulator 102 and is fixed. In other words, if a different set of pseudo-random sampling functions is selected for another image a new random pattern digital light modulator 102 must be printed.

As a result, the single pixel camera 100 of the present disclosure uses a pseudo-random pattern digital light modulator 112 that has a smaller footprint for portable cameras. In addition, the pseudo-random pattern digital light modulator 112 is cheaper to produce than the DMD currently used.

Figure 5:
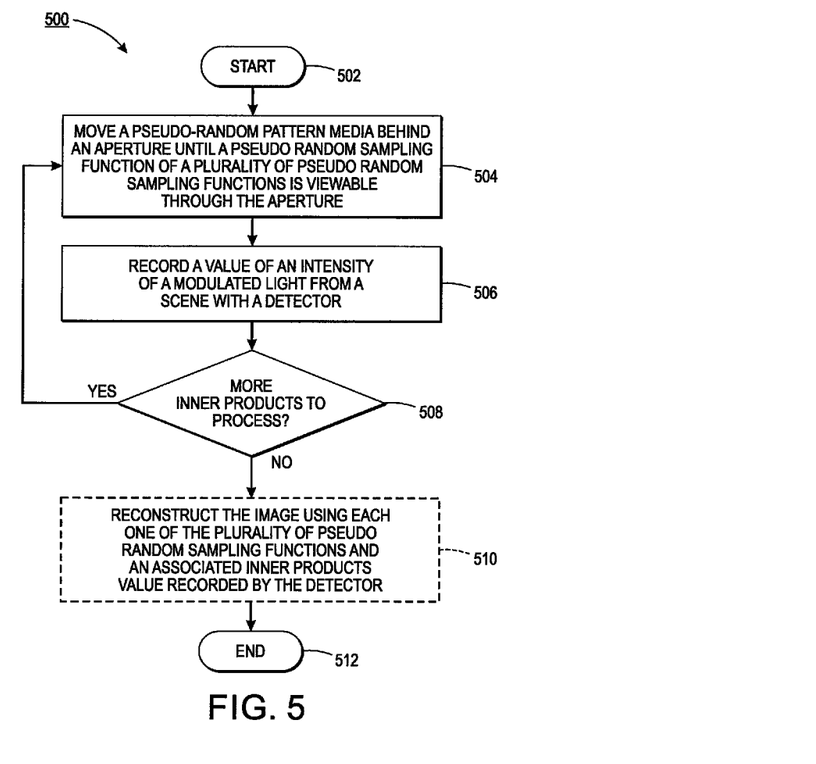
FIG. 5 illustrates an example flowchart of one embodiment of a method for compressive imaging of a scene in a single pixel camera.
Figure 6:
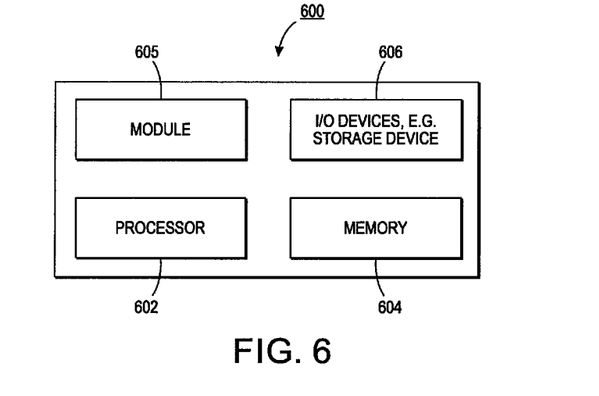
FIG. 6 illustrates a high-level block diagram of a general-purpose computer suitable for use in performing the functions described herein.

FIG. 5 illustrates a flowchart of a method 500 for compressive imaging of a scene in a single pixel camera. In one embodiment, one or more steps or operations of the method 500 may be performed by the single pixel camera 100 or a general-purpose computer as illustrated in FIG. 6 and discussed below.

At step 502 the method 500 begins. At step 504, the method 500 moves a pseudo-random pattern media behind an aperture until a pseudo-random sampling function of a plurality of pseudo-random sampling functions is viewable through the aperture. For example, the single pixel camera may be pointed towards an object of which the single pixel camera will take an image using compressive sensing. The pseudo-random pattern media may be moved behind the aperture to take a sample (e.g., measure the amount of light entering the single pixel camera through a system of lenses and filters towards the pseudo-random pattern digital light modulator) of the object for one of the pseudo-random sampling patterns on the pseudo-random pattern media. The pseudo-random pattern media may be moved one pixel at a time behind the aperture until a sample of the object is sensed for all of the pseudo-random sampling patterns printed on the random pattern media.

In one embodiment, the aperture may have a viewable opening that is the same size as each one of the plurality of pseudo-random sampling functions. The pseudo-random pattern media may be similar to the pseudo-random pattern media 102 discussed above.

At step 506, the method 500 records a value of an intensity of a modulated light from a scene with a detector. The value of the intensity of the modulated light may be representative of an inner product between the pseudo-random sampling function and an image of the scene. For example, the light may be modulated by the pseudo-random pattern digital light modulator 112. The modulated light may be received by the detector 118 and integrated into an intensity value of the modulated light from the scene. The intensity value of the modulated light may be representative of the inner product. In one embodiment, the portions of the pseudo-random sampling function that allows light to be redirected (e.g., via either a transmissive mode of operation or a reflective mode of operation) towards a detector is recorded as a value of 1.

At step 508, the method 500 determines if there are more inner products that need to be selected and measured. As noted above, the method 500 is repeated until a necessary number of measurements of inner products between pseudo-random sampling functions on the pseudo-random pattern media and an image of the scene are processed. If there are more measurements of inner products that need to be processed, the method 500 returns to step 504 to move to the next pseudo-random sampling function on the pseudo-random pattern media. For example, a motor coupled to the pseudo-random pattern media may move the pseudo-random pattern media vertically or horizontally one pixel to allow the next pseudo-random sampling function to be viewable through the aperture. Notably, even though the pseudo-random pattern media is moved by only one pixel length or width, the pseudo-random sampling function that is viewed through the aperture is different from the previously viewed pseudo-random sampling function on the pseudo-random pattern media and largely uncorrelated to the previous pseudo-random sampling function that was previously viewed. If there are no more pseudo-random sampling functions that need to be selected and sampled, the method 400 may proceed to optional step 510.

At optional step 510, the method 500 may reconstruct the image using each one of the plurality of pseudo-random sampling functions and an associated inner products value recorded by the detector. In other words, the method 500 does not necessarily require immediate reconstruction of the image. For example, the values of inner products for each one of the plurality of pseudo-random sampling functions may be stored or transmitted to a separate receiving system or processor. In other words, the same system performing the compressive sensing of the image does not necessarily need to also perform the reconstruction of the image.

Alternatively, if the reconstruction of the image occurs within the same system using the same processor that performed the compressive sensing of the image the optional step 510 may be performed to reconstruct the image. At step 512, the method 500 ends.

It should be noted that although not explicitly specified, one or more steps, functions, or operations of the method 500 described above may include a storing, displaying and/or outputting step as required for a particular application. In other words, any data, records, fields, and/or intermediate results discussed in the methods can be stored, displayed, and/or outputted to another device as required for a particular application. Furthermore, steps, functions, or operations in FIG. 5 that recite a determining operation, or involve a decision, do not necessarily require that both branches of the determining operation be practiced. In other words, one of the branches of the determining operation can be deemed as an optional step.

FIG. 6 depicts a high-level block diagram of a general-purpose computer suitable for use in performing the functions described herein. As depicted in FIG. 6, the system 600 comprises one or more hardware processor elements 602 (e.g., a central processing unit (CPU), a microprocessor, or a multi-core processor), a memory 604, e.g., random access memory (RAM) and/or read only memory (ROM), a module 605 for compressive imaging of an image in a single pixel camera, and various input/output devices 606 (e.g., storage devices, including but not limited to, a tape drive, a floppy drive, a hard disk drive or a compact disk drive, a receiver, a transmitter, a speaker, a display, a speech synthesizer, an output port, an input port and a user input device (such as a keyboard, a keypad, a mouse, a microphone and the like)). Although only one processor element is shown, it should be noted that the general-purpose computer may employ a plurality of processor elements. Furthermore, although only one general-purpose computer is shown in the figure, if the method(s) as discussed above is implemented in a distributed or parallel manner for a particular illustrative example, i.e., the steps of the above method(s) or the entire method(s) are implemented across multiple or parallel general-purpose computers, then the general-purpose computer of this figure is intended to represent each of those multiple general-purpose computers. Furthermore, one or more hardware processors can be utilized in supporting a virtualized or shared computing environment. The virtualized computing environment may support one or more virtual machines representing computers, servers, or other computing devices. In such virtualized virtual machines, hardware components such as hardware processors and computer-readable storage devices may be virtualized or logically represented.

It should be noted that the present disclosure can be implemented in software and/or in a combination of software and hardware, e.g., using application specific integrated circuits (ASIC), a programmable logic array (PLA), including a field-programmable gate array (FPGA), or a state machine deployed on a hardware device, a general purpose computer or any other hardware equivalents, e.g., computer readable instructions pertaining to the method(s) discussed above can be used to configure a hardware processor to perform the steps, functions and/or operations of the above disclosed methods. In one embodiment, instructions and data for the present module or process 605 for compressive imaging of an image in a single pixel camera (e.g., a software program comprising computer-executable instructions) can be loaded into memory 604 and executed by hardware processor element 602 to implement the steps, functions or operations as discussed above in connection with the exemplary method 500. Furthermore, when a hardware processor executes instructions to perform "operations", this could include the hardware processor performing the operations directly and/or facilitating, directing, or cooperating with another hardware device or component (e.g., a co-processor and the like) to perform the operations.

The processor executing the computer readable or software instructions relating to the above described method(s) can be perceived as a programmed processor or a specialized processor. As such, the present module 605 for compressive imaging of an image in a single pixel camera (including associated data structures) of the present disclosure can be stored on a tangible or physical (broadly non-transitory) computer-readable storage device or medium, e.g., volatile memory, non-volatile memory, ROM memory, RAM memory, magnetic or optical drive, device or diskette and the like. More specifically, the computer-readable storage device may comprise any physical devices that provide the ability to store information such as data and/or instructions to be accessed by a processor or a computing device such as a computer or an application server.

It will be appreciated that variants of the above-disclosed and other features and functions, or alternatives thereof, may be combined into many other different systems or applications. Various presently unforeseen or unanticipated alternatives, modifications, variations, or improvements therein may be subsequently made by those skilled in the art which are also intended to be encompassed by the following claims.

What is claimed is:

1. A method for compressive imaging of a scene in a single pixel camera, comprising:
    moving, by the processor, a pseudo-random pattern media behind an aperture until a pseudo-random sampling function of a plurality of pseudo-random sampling functions is viewable through the aperture;
    recording, by the processor, a value of an intensity of a modulated light from the scene with a detector, wherein the intensity of the modulated light is representative of an inner product between the pseudo-random sampling function and an image of the scene; and repeating, by the processor, the moving and the recording until a necessary number of a plurality of inner products are processed.

2. The method of claim 1, further comprising:
reconstructing, by the processor, the image using each one of the plurality of pseudo-random sampling functions and one or more values of associated inner products recorded by the detector.

3. The method of claim 1, the necessary number of the plurality of inner products corresponds to a number of the plurality of pseudo-random sampling functions that is a function of a desired compression ratio of a reconstructed image of the scene.

4. The method of claim 1, wherein the moving comprises moving the pseudo-random pattern media in a vertical direction or a horizontal direction.

5. The method of claim 4, wherein an amount of the moving comprises increments of one or more pixel lengths in the vertical direction or one or more pixel widths in the horizontal direction.

6. The method of claim 1, wherein a number of the plurality of pseudo-random sampling functions on the pseudo-random pattern media is a function of a desired quality of reconstruction of the scene.

7. The method of claim 6, wherein the plurality of pseudo-random sampling functions is fabricated into a physical medium and fixed.

8. The method of claim 1, wherein a size of each one of the plurality of pseudo-random sampling functions on the pseudo-random pattern media is equal to a projected size of the aperture onto a plane defined by the pseudo-random pattern media.

9. The method of claim 1, wherein the moving the pseudo-random pattern media by one or more pixel lengths in a vertical direction or one or more pixel widths in a horizontal direction selects a different one of the plurality of pseudo-random sampling functions that are viewable through the aperture on the pseudo-random pattern digital light modulator.

10. The method of claim 1, wherein the pseudo-random pattern media operates in a transmissive mode.

11. The method of claim 10, wherein the transmissive mode directs a light signal through an optically clear portion of the pseudo-random pattern digital light modulator at a designated angle toward the detector and blocks the light signal by a reflective portion of the pseudo-random pattern digital modulator.

12. The method of claim 11, wherein a level of opaqueness of the optically clear portion controls an amount of the light signal that is directed towards the detector.

13. The method of claim 1, wherein the pseudo-random pattern media operates in a reflective mode.

14. The method of claim 13, wherein the reflective mode reflects a light signal by a reflective portion of the random pattern digital modulator at a designated angle towards the detector and allows the light signal through an optically clear portion of the pseudo-random pattern digital modulator away from the detector.

15. A non-transitory computer-readable medium storing a plurality of instructions which, when executed by a processor, cause the processor to perform operations for compressive imaging of a scene in a single pixel camera, the operations comprising:

moving a pseudo-random pattern media behind an aperture until a pseudo-random sampling function of a plurality of pseudo-random sampling functions is viewable through the aperture;

recording a value of an intensity of a modulated light from the scene with a detector, wherein the intensity of the modulated light is representative of an inner product between the pseudo-random sampling function and an image of the scene; and repeating the moving and the recording until a necessary number of a plurality of inner products are processed.

16. The non-transitory computer-readable medium of claim 15, further comprising:
reconstructing the image using each one of the plurality of pseudo-random sampling functions and one or more values of associated inner products recorded by the detector.

17. The non-transitory computer-readable medium of claim 15, wherein in the moving comprises moving the pseudo-random pattern media in a vertical direction or a horizontal direction.

18. The non-transitory computer-readable medium of claim 17, wherein an amount of the moving comprises increments of one or more pixel lengths in a vertical direction or one or more pixel widths in the horizontal direction.

19. The non-transitory computer-readable medium of claim 15, wherein each one of the plurality of pseudo-random sampling functions are printed and fixed in a position on the pseudo-random pattern media.

20. A single pixel camera, comprising:
a first imaging system;
a pseudo-random pattern media comprising a physical medium, wherein a plurality of pseudo-random sampling functions is printed into the physical medium, wherein the plurality of pseudo-random sampling functions overlap and are separated by a single pixel in a vertical direction or a horizontal direction, wherein each one of the plurality of pseudo-random sampling functions comprises a plurality of optically clear portions and a plurality of reflective portions;
a motor coupled to the pseudo-random pattern media for moving the pseudo-random pattern media one or more pixel lengths at a time in the vertical direction or one or more pixel widths in the horizontal direction;
an aperture coupled to the first imaging system and the pseudo-random pattern media, wherein a projected size of the aperture onto a plane defined by the pseudo-random pattern media is a same size as one of the plurality of pseudo-random sampling functions, wherein the pseudo-random pattern media is positioned behind the aperture to select one of the plurality of pseudo-random sampling functions printed in the pseudo-random pattern media;
a collection imaging system coupled to the pseudo-random pattern media to collect light signals redirected by a selected pseudo-random sampling function; and
a detector coupled to the collection imaging system to record a value of inner products of each pixel of each one of the plurality of random sampling functions for the image.

* * * * *